United States Patent
Willsch et al.

(10) Patent No.: US 6,208,129 B1
(45) Date of Patent: Mar. 27, 2001

(54) OPTICAL METHOD AND ARRANGEMENT FOR MEASURING A PERIODIC VALUE HAVING AT LEAST ONE FREQUENCY COMPONENT

(75) Inventors: Michael Willsch, Fürth; Thomas Bosselmann, Marloffstein; Peter Menke, Bötzow; Stefan Hain, Effeltrich, all of (DE)

(73) Assignee: Siemens AG, Munich (DE)

( * ) Notice: Subject to any disclaimer, the term of this patent is extended or adjusted under 35 U.S.C. 154(b) by 0 days.

(21) Appl. No.: 09/077,432
(22) PCT Filed: Dec. 2, 1996
(86) PCT No.: PCT/DE96/02311
 § 371 Date: Aug. 18, 1998
 § 102(e) Date: Aug. 18, 1998
(87) PCT Pub. No.: WO97/22883
 PCT Pub. Date: Jun. 26, 1997

(30) Foreign Application Priority Data

Dec. 15, 1995 (DE) .............................. 195 47 021

(51) Int. Cl.⁷ .................................................... G01R 33/01
(52) U.S. Cl. .......................................... 324/96; 324/117 R
(58) Field of Search .............................. 324/96, 750, 752, 324/753, 117 R, 244.1; 250/231.1, 225, 227, 310, 311

(56) References Cited

U.S. PATENT DOCUMENTS

| | | | |
|---|---|---|---|
| 4,973,899 | 11/1990 | Jones et al. | ............................. 324/96 |
| 5,446,381 | * 8/1995 | Okajima et al. | ......................... 324/96 |
| 5,656,934 | * 8/1997 | Bosselmann | ..................... 324/117 R |
| 5,764,046 | * 6/1998 | Bosselmann | ............................ 324/96 |

FOREIGN PATENT DOCUMENTS

| | | |
|---|---|---|
| 43 12 183 | 10/1994 | (DE) . |
| 43 34 469 | 4/1995 | (DE) . |
| 43 42 410 | 6/1995 | (DE) . |
| 0 088 419 | 9/1983 | (EP) . |
| 0 108 671 | 5/1984 | (EP) . |
| 0 682 261 | 11/1995 | (EP) . |
| 02143173 | 6/1990 | (JP) . |
| WO 95/10046 | 4/1995 | (WO) . |

OTHER PUBLICATIONS

H. Hirsch, et al. "Nutz–und Storeffekte in Linearen Faseroptischen Stromwandlern", Technisches Messen 58 (1991), pp 106–109, (month unavailable).

\* cited by examiner

Primary Examiner—Vinh P. Nguyen
(74) Attorney, Agent, or Firm—Kenyon & Kenyon

(57) ABSTRACT

Polarized measuring light propagates through a sensor device and is then split into two differently linearly polarized partial light signals. An intensity-normalized measuring signal is derived from the two partial light signals and their direct components.

8 Claims, 2 Drawing Sheets

OPTICAL METHOD AND ARRANGEMENT FOR MEASURING A PERIODIC VALUE HAVING AT LEAST ONE FREQUENCY COMPONENT

FIELD OF THE INVENTION

The present invention relates to a method and an arrangement for measuring a periodic quantity. A periodic quantity is used herein to describe a measurable quantity which, in its frequency spectrum, only has frequency components that differ from zero and is, thus, in particular, a measurable quantity that varies with time.

BACKGROUND OF THE INVENTION

PCT Application No. W/O 95/10046, describes optical measuring arrangements and measuring methods for measuring a periodic quantity, in particular for measuring a magnetic alternating field or an electric a.c. current, utilizing the magnetooptic Faraday effect, or for measuring an electric alternating field or an electric a.c. voltage utilizing the electrooptical Pockels effect. Polarized measuring light is coupled into a sensor device that is under the influence of the periodic quantity. The polarization of the measuring light is varied in the sensor device as a function of the periodic quantity. To analyze this change in polarization, after propagating at least once through the sensor device, the measuring light is split into two linearly polarized partial light signals having different polarization planes. An intensity-normalized signal P is formed, which corresponds to the quotient of a difference and the sum of the light intensities of the two partial light signals. A temperature-compensated measuring signal is derived from an alternating signal component and from a direct signal component of the intensity-normalized signal. In this context, the direct signal component does not contain any frequency components of the periodic quantity and is only used for temperature compensation.

"*Optical Combined Current & Voltage H.V. Sensors, GEC Alsthom*, T&D, describes a magnetooptical current transformer in which a light signal that is linearly polarized in a polarizer propagates through a Faraday glass ring and is then split by a polarizing beam splitter into two partial light signals, which are linearly polarized, transversely with respect to one another (two-channel polarization analysis). Each of the two partial light signals is fed via an optical fiber to a corresponding photodiode, which converts the partial light signal in question into an electric intensity signal S1 or S2, which is proportional to the light intensity of the corresponding partial light signal. Due to the different attenuation in the two optical fibers, the two proportionality constants can differ from one another at this point. To compensate for these differences in responsivity, provision is made for a special closed-loop control. A controllable first amplifier connected downstream from the first photodiode amplifies the intensity signal S1 by a corresponding gain K1, and a second amplifier connected downstream from the second photodiode amplifies the second intensity signal S2 by a second gain K2. At this point, direct signal components (DC values) of the two intensity signals S1 and S2 are determined, and the difference between the two direct signal components is set to zero by controlling the gain K1 of the first amplifier. From the two intensity signals K1·S1 and K2·S2, which are generally amplified with varying intensity, at the outputs of the two amplifiers, a measuring signal is now formed, which corresponds to the quotient (K1·S1−K2·S2)/(K1·S1+K2·S2) of the difference and the sum of the output signals of the amplifiers.

SUMMARY OF THE INVENTION

An object of the present invention is to provide an optical measuring method and an optical measuring arrangement for measuring a periodic quantity, where the polarization state of polarized measuring light in a sensor device is varied as a function of the periodic quantity, and the measuring light for analyzing this change in polarization is split, after propagating through at least once, into two variably linearly polarized, partial light signals, and undesired intensity variations in the light paths of the measuring light and of the two partial light signals are compensated.

A method for measuring a periodic quantity according to the present invention includes the following method steps:

a) polarized measuring light propagates at least once through a sensor device that is under the influence of the periodic quantity, the sensor device varying the polarization of the measuring light as a function of the periodic quantity, and is then split into two linearly polarized partial light signals having light intensities I1 and I2 and different polarization planes;

b) from the light intensities I1 and I2 of the two partial light signals and direct components $I1_{DC}$ or $I2_{DC}$ of these two light intensities I1 and I2, a measuring signal is formed for the periodic quantity, which is essentially proportional to the quotient $$(I2_{DC} \cdot I1 - I1_{DC} \cdot I2)/(I2_{DC} \cdot I1 + I1_{DC} \cdot I2),$$

the two direct components $I1_{DC}$ or $I2_{DC}$ not containing any frequency components of the periodic quantity.

An arrangement for measuring a periodic quantity according to the present invention includes:

a) a sensor device, which varies the polarization of polarized light as a function of the periodic quantity;

b) means for coupling polarized measuring light into the sensor device;

c) means for splitting the measuring light, after propagating at least once through the sensor device, into two linearly polarized partial light signals having different polarization planes and having light intensities I1 or I2;

d) means for generating a measuring signal for the periodic quantity from light intensities I1 and I2 of the two partial light signals and direct components $I1_{DC}$ or $I2_{DC}$ of these two light intensities I1 or I2, which do not contain any frequency components of the periodic quantity, the measuring signal essentially being proportional to the quotient $$(I2_{DC} \cdot I1 - I1_{DC} \cdot I2)/(I2_{DC} \cdot I1 + I1_{DC} \cdot I2).$$

Because of the special consideration given to the direct signal components $I1_{DC}$ and $I2_{DC}$ of the two light intensities I1 or I2 as an index for the mentioned intensity variations in the light paths, the measuring signal is virtually completely intensity-normalized.

Accordingly, the method and the arrangement are preferably used in a first advantageous specific embodiment for measuring a magnetic alternating field, in that a sensor device indicating the magnetooptical Faraday effect is used, and the measuring signal is retrieved as an index for the magnetic alternating field.

In a second advantageous specific embodiment, the method and arrangement for measuring an electric a.c. voltage or an electric alternating field in which a sensor device indicating the electrooptical Pockels effect is used, and the measuring signal is retrieved as an index for the electric a.c. voltage or for the electric alternating field.

The two partial light signals are preferably transmitted in each case via at least one optical fiber and, in particular, via at least two optical fibers and one optical connector for detachably joining the two optical fibers. The connectors are advantageously used for temporarily disconnecting the sensor device that is generally linked to different electric potentials, on the one hand, and the evaluation electronics, on the other hand. In this specific embodiment, the measuring signal is also independent of light intensity variations in the two partial light signals in response to variations in the attenuation properties of the connectors following their opening and subsequent closing.

DETAILED DESCRIPTION

Figure 1:
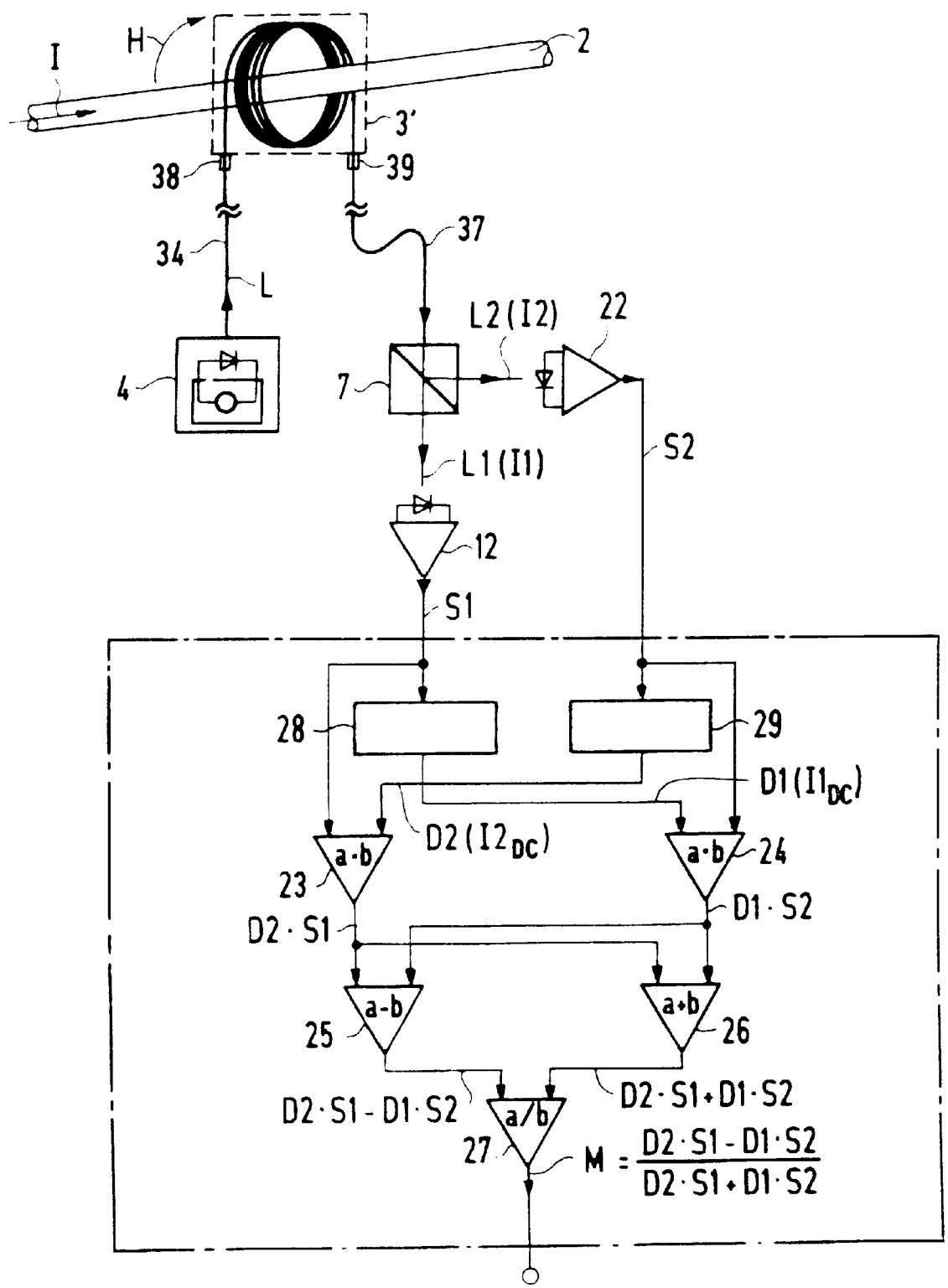
FIG. 1 shows an exemplary embodiment of a measuring arrangement for measuring a magnetic alternating field, in particular of the magnetic alternating field of an electric a.c. current.

FIG. 1 depicts an optical measuring arrangement for measuring a magnetic alternating field H, in particular for measuring an electric a.c. current I in a current conductor 2. A Faraday sensor device 3 is allocated to magnetic alternating field H. Sensor device 3 is made of an optical waveguide, preferably an optical fiber, which surrounds current conductor 2 in a measuring winding having at least one measuring turn, and which exhibits the magnetooptical Faraday effect. As Faraday sensor device 3, provision can also be made, however, for one or a plurality of solid bodies made of a Faraday material, which form(s) a light path, preferably a glass ring, preferably surrounding current conductor 2. It is also not necessary for Faraday sensor device 3 to surround current conductor 2 in a closed light path; it may also be merely disposed in the proximity of current conductor 2, within magnetic field H of a.c. current I.

Linearly polarized measuring light L is preferably coupled via a polarization-maintaining optical waveguide 34 into sensor device 3. To produce this linearly polarized measuring light L, provision can be made for a light source and allocated polarizing means (not shown), or also for a self-polarizing light source 4, for example a laser diode and, if indicated, additional polarizing means (not shown). The linearly polarized measuring light L propagates at least once through sensor device 3 and is subjected, in the process, to a Faraday rotation ρ of its polarization plane as a function of magnetic alternating field H or of electric a.c. current I. After propagating through sensor device 3, measuring light L is fed to an analyzer 7 and is split in analyzer 7 into two linearly polarized partial light signals L1 and L2, whose polarization planes differ from one another. The polarization planes of the two partial light signals L1 and L2 are preferably aligned transversely to one another (orthogonal splitting). As analyzer 7, provision can be made for a polarizing beam splitter, for example a Wollaston prism, or also for a simple beam splitter having a semi-reflective mirror with two polarization filters, which are optically coupled downstream and crossed at an appropriate angle, preferably 90°. Sensor device 3 and analyzer 7 can be optically coupled to one another via a free-beam arrangement or also via a polarization-maintaining optical waveguide 37, preferably a monomode optical waveguide, such as a HiBi (high birefringence) fiber or a polarization-neutral LoBi (low birefringence) fiber. The optical waveguide of sensor device 3 is connected to optical waveguide 34 for supplying measuring light L, and to optical waveguide 37 for removing measuring light L, in each case preferably via a splice 38 or 39.

In one specific embodiment (not shown), measuring light L, after propagating through a first time, is reflected back into Faraday sensor device 3, and propagates through Faraday sensor device 3 a second time in the reverse direction (reflection type), before being split into partial light signals L1 and L2.

The two partial light signals L1 and L2 are each fed to a photoelectric transducer 12 or 22, preferably in each case to a photodiode arranged in an amplifier circuit. As described, the two partial light signals L1 and L2 can be transmitted from analyzer 7 to transducer 12 or 22 in question via a free-beam arrangement or, in each case, via an optical waveguide. The first photoelectric transducer 12 converts first light signal L1 into a first electric intensity signal S1, which is essentially proportional to light intensity I1 of first light signal L1, thus $S1 = K1 \cdot I1$. Second photoelectric transducer 22 converts second light signal L2 into a second electric intensity signal S2, which is essentially proportional to light intensity I2 of second light signal L2, thus $S2 = K2 \cdot I2$. Proportionality factors K1 and K2 of these conversions are determined by the photoelectric efficiency and by the subsequent amplifications of the signals in transducers 21 and 22, and can also change over time due to interference effects.

The two intensity signals S1 and S2 are analyzed at this point in an evaluation unit 20, preferably in the following manner. Each of the two electric intensity signals S1 and S2 is fed to an input of a corresponding first multiplier 23 or to a second multiplier 24, and to an input of a corresponding first filter 28 or second filter 29 having low-pass character. First filter 28 generates a direct signal component D1 of first intensity signal S1, which corresponds to the K1-fold direct component $I1_{DC}$ of light intensity I1 of first light signal L1, thus $D1 = K1 \cdot I1_{DC}$. Direct signal component D1 of first intensity signal S1 active at an output of filter 28 is fed to a second input of first multiplier 23. Second filter 29 generates a direct signal component D2 of second intensity signal S2, which corresponds to the K2-fold direct component $I1_{DC}$ of light intensity I2 of second light signal L2, thus $D2 = K2 \cdot I2_{DC}$. Direct signal component D2 of second intensity signal S2 active at an output of second filter 29 is fed to a second input of second multiplier 24. As filters 28 and 29, analog or digital low-pass filters can be used, for example, whose separation frequencies are adjusted to be lower, in each case, than the lowest frequency in the spectrum of the periodic quantity, thus, in the depicted specific embodiment, of magnetic alternating field H or of electric alternating current I. The two direct signal components D1 and D2 and, thus, also the two direct light components $I1_{DC}$ and $I2_{DC}$ do not contain any information about the periodic quantity (in particular the magnetic alternating field H), however they do contain the information about an undesirable operating point drift of the two light intensities I1 and I2. This information about an intensity drift is now used, as follows, for deriving an intensity-normalized measuring signal. First multiplier 23 forms the product D2·S1 of first intensity signal S1 and of direct signal component D2 of second intensity signal S2. Second multiplier 24 forms the product D1·S2 of direct signal component D1 of first intensity signal S1 and of second intensity signal S2. These two products D2·S1 and D1·S2 are now fed from the output of corresponding multiplier 23 or 24, in each case to an input of a subtracter 25 and an input of an adder 26. Differential signal D2·S1−D1·S2 of the two product signals D2·S1 and D1·S2 formed by subtracter 25 is applied to a first input of a divider 27. The composite signal D2·S1+D1·S2 of the two products D2·S1 and D1·S2 formed by adder 26 is active at the second input of divider 27. At an output of divider 27, the measuring signal $$M=(D2 \cdot S1 - D1 \cdot S2)/(D2 \cdot S1 + D1 \cdot S2) \quad (1)$$

can now be tapped off for the magnetic alternating field H or for the electric alternating current I corresponding to the quotient signal from the difference D2·S1−D1·S2 and the sum D2·I1+D1·I2.

In a slightly altered specific embodiment (not shown) of the signal evaluation in evaluation unit 20, a quotient of two direct signal components D1 and D2 is initially determined as correction factor K=D1/D2. This correction factor K is used to form a measuring signal $$M'=(S1 - K \cdot S2)/(S1 + K \cdot S2) \quad (2).$$

The two measuring signals M according to equation (1) and M' according to equation (2) are both equivalent to the quotient formed directly from light intensities I1 and I2 and their direct components $I1_{DC}$ and $I2_{DC}$:

$$M=M'=(I1 \cdot I2_{DC} - I2 \cdot I1_{DC})/(I1 \cdot I2_{DC} + I2 \cdot I1_{DC}) \quad (3)$$

Thus, the responsivities K1 and K2 of the two transducers 12 and 22 drop out when measuring signal M according to equation (1) or measuring signal M' according to equation (2) is formed.

One advantage of the described specific embodiment of evaluation unit 20 having analog arithmetic modules is rapid signal processing. Of course, measuring signal M or M' can also be ascertained with the aid of a table of values and/or with the aid of digital modules.

In addition, measuring signal M or M' is virtually completely intensity-normalized according to one of equations (1) to (3). This means that undesired changes in light intensities I1 and I2 of the two partial light signals L1 and L2 caused by transmission losses no longer have an effect on measuring signal M or M'.

At this point, from measuring signal M or M', electric a.c. current I in current conductor 2 can be determined with the aid of the equation ρ=N V I, V being the Verdet constant of the Faraday effect in sensor device 3, and N the number of revolutions of measuring light L around current conductor 2.

Figure 2:
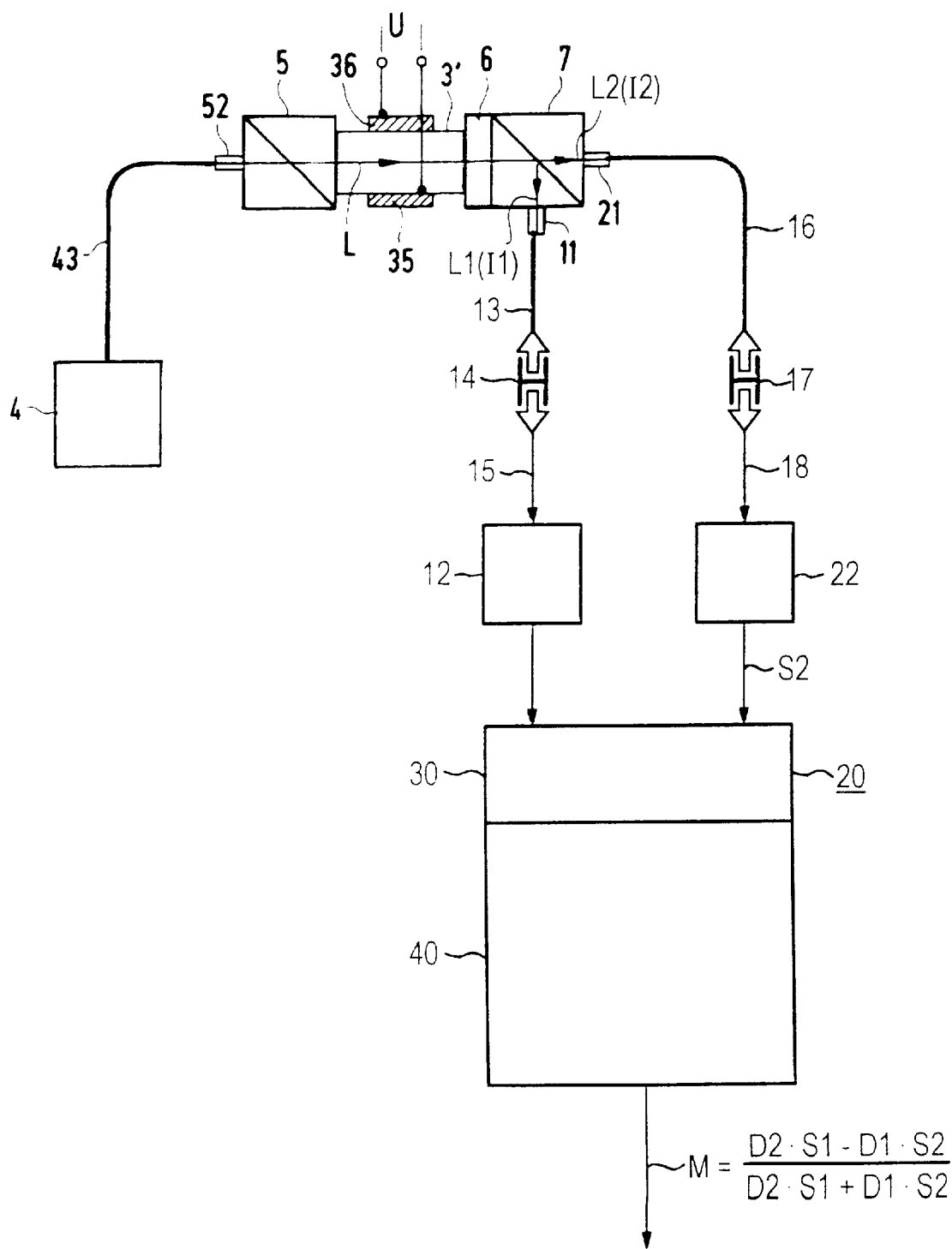
FIG. 2 shows an exemplary embodiment of a measuring arrangement for measuring an electric a.c. voltage.

FIG. 2 depicts a specific embodiment of an optical measuring arrangement for measuring an electric a.c. voltage U as periodic quantity X including a sensor device 3 for indicating the electrooptical Pockels effect. A.c. voltage U to be measured is able to be applied via two electrodes 35 and 36 to Pockels-sensor device 3'. Polarized measuring light L is coupled into Pockels-sensor device 3'. This measuring light L propagates through Pockels-sensor device 3' and is subjected, in the process, to a change in its polarization as a function of applied a.c. voltage U. In the depicted specific embodiment, a.c. voltage U is applied transversely to the light propagation direction of measuring light L (transversal specific embodiment), but can also be applied in parallel to the light propagation direction (longitudinal specific embodiment). As means for coupling measuring light L into sensor device 3', provision is made for a light source 4, for example a light-emitting diode, and a polarizer 5 for linearly polarizing the light from light source 4. Light source 4 and polarizer 5 are preferably optically coupled to one another via an optical waveguide 43, for example a multimode optical fiber, but can also be optically coupled to one another by a free-beam coupling. To couple the light from optical waveguide 43 into polarizer 4, provision is preferably made for a collimator lens (e.g., grade-index lens [i.e., GRIN lens]) 25. Measuring light L, which is linearly polarized at this point, is coupled from polarizer 5 into Pockels-sensor device 3'. After propagating through Pockels-sensor device 3, measuring light L is fed via a λ/4 platelet (quarter-wave platelet) 6 to analyzer 7. In analyzer 7, measuring light L is split into two linearly polarized partial light signals L1 and L2, whose planes of polarization differ from one another. The planes of polarization of the two partial light signals L1 and L2 are preferably directed transversely to one another (orthogonal splitting). As analyzer 7, provision can be made for a polarizing beam splitter, for example a Wollaston prism, or also for two polarization filters, which are crossed by a predefined angle, preferably 90°, and for an upstream, simple beam splitter.

The operating point of the measuring arrangement according to FIG. 2 is preferably adjusted in such a way that circularly polarized measuring light is applied to analyzer 7 when no electric field is applied to Pockels-sensor device 3'. The two intrinsic axes of the linear birefringence in Pockels-sensor device 3' are "uniformly illuminated" in this case by measuring light L. This means that the components of measuring light L projected onto the two intrinsic axes exhibit the same intensity. Generally, then, the two partial light signals L1 and L2 are likewise of equal intensity. When an a.c. voltage (U≠0V) is applied to Pockels-sensor device 3', the intensity of the components of measuring light L along the electrooptically active intrinsic axes of the linear birefringence of Pockels-sensor device 3' is altered as a function of a.c. voltage U.

In place of the optical series connection, as shown in FIG. 2, of polarizer 5, of Pockels-sensor device 3', of λ/4 platelet 6, and of analyzer 7, provision can also be made for an optical series connection of polarizer 5, of λ/4 platelet 6, of Pockels-sensor device 3', and of analyzer 7, thus the order of λ/4 platelet 6 and of sensor device 3' would be exactly reversed. In this case, measuring light L is circularly polarized before being coupled into Pockels-sensor device 3'. Moreover, in place of light source 4 and polarizer 5, provision can also be made for a light source for transmitting linearly polarized light, such as a laser diode, for coupling polarized measuring light L into sensor device 3' or λ/4 platelet 6. Optical waveguide 43 is then preferably a polarization-maintaining optical waveguide. In addition, partial light signals L1 or L2 can also be transmitted in a free-beam arrangement. Moreover, analyzer 7 can be optically coupled to λ/4 platelet 6 or to Pockels-sensor device 3' via a polarization-maintaining optical waveguide.

The two partial light signals L1 and L2 are preferably coupled via a collimator lens 11 and 21, respectively, into an optical waveguide 13 and 16, respectively. Optical waveguides 13 and 16 are each connected via an optical connector 14 and 17, respectively, to another optical waveguide 15 and 18, respectively. Sensor device 3 is detachable from evaluation unit 20 by way of connectors 14 and 17. At this point, the two partial light signals L1 and L2 are coupled via corresponding connectors 14 and 17 and the corresponding, other optical waveguides 15 or 18. After propagating through Pockels-sensor device 3, measuring light L is fed via a λ/4 platelet 6 to analyzer 7. In analyzer 7, measuring light L is split into two linearly polarized partial light signals L1 and L2, whose planes of polarization differ from one another. The planes of polarization of the two partial light signals L1 and L2 are preferably directed transversely to one another (orthogonal splitting). As analyzer 7, provision can be made for a polarizing beam splitter, for example a Wollaston prism, or also for two polarization filters, which are crossed by a predefined angle, preferably 90°, and for a simple beam splitter. Provision can also be made for the connectors in all other specific embodiments of the measuring arrangement, in particular in the one depicted in FIG. 1.

The two electric intensity signals S1 and S2 are digitized with the aid of analog/digital converter 30, and the digitized signals are processed further by a microprocessor or a digital signal processor 40 to generate a measuring signal M according to equation (1) or M' according to equation (2). Analog/digital converter 30 and processor 40 then form evaluation unit 20. Processor 40 filters direct signal components D1 and D2 in a digital operation, and then calculates measuring signal M or M' according to equation (1) or (2).

What is claimed is:

1. A method for measuring a periodic variable having at least one frequency component, the method comprising the steps of:

propagating a polarized measuring light having a polarization at least once through a sensor device, the sensor device being under an influence of the periodic variable;

varying by the sensor device the polarization of the polarized measuring light as a function of the periodic variable;

splitting the polarized measuring light into a first linearly polarized partial light signal and a second linearly polarized partial light signal, the first linearly polarized partial light signal having a first polarization plane and a first light intensity, the first light intensity having a first direct component, the second linearly polarized partial light signal having a second polarization and a second light intensity, the second light intensity having a second direct component;

generating a first proportional electric intensity signal as a function of the first light intensity of the first linearly polarized partial light signal;

generating a second proportional electric intensity signal as a function of the first direct component of the first light intensity;

generating a third proportional electric intensity signal as a function of the second light intensity of the second linearly polarized partial light signal;

generating a fourth proportional electric intensity signal as a function of the second direct component of the second light intensity; and generating a measuring signal as a function of the first proportional electric intensity signal, the second proportional electric intensity signal, the third proportional electric intensity signal, and the fourth proportional electric intensity signal, the measuring signal being proportional to the following quotient:

$$(I2_{DC} \cdot I1 - I1_{DC} \cdot I2)/(I2_{DC} \cdot I1 + I1_{DC} \cdot I2),$$

wherein I1 is the first light intensity of the first linearly polarized partial light signal, wherein $I1_{DC}$ is the first direct component of the first light intensity, wherein I2 is the second light intensity of the second linearly polarized partial light signal, wherein $I2_{DC}$ is the second direct component of the second light intensity, wherein the first polarization plane of the first linearly polarized partial light signal is different from the second polarization plane of the second linearly polarized partial light signal, and wherein the first direct component and the second direct component do not contain any one of the at least one frequency components of the periodic variable.

2. The method according to claim 1, wherein the periodic variable includes a magnetic alternating field, the sensor device includes a Faraday effect sensing device, and the measuring signal indicates an index for the magnetic alternating field.

3. The method according to claim 1, wherein the periodic variable includes at least one of an electric a.c. voltage and an electric alternating field, the sensor device includes a Pockels effect sensing device, and the measuring signal indicates an index for the at least one of the electric a.c. voltage and the electric alternating field.

4. An arrangement for measuring a periodic variable having at least one frequency component, comprising:

a sensor device receiving through a coupling member a polarized measuring light having a polarization, the polarized measuring light propagating at least once through the sensor device, the sensor device varying the polarization of the polarized measuring light as a function of the periodic variable a splitter device for splitting the polarized measuring light into a first linearly polarized partial light signal and a second linearly polarized partial light signal, the first linearly polarized partial light having a first polarization and a first light intensity, the first light intensity having a first direct component, the second linearly polarized partial light having a second polarization and a second light intensity, the second light intensity having a second direct component;

a first circuit arrangement generating:

a first proportional electric intensity signal as a function of the first light intensity of the first linearly polarized partial light signal, a second proportional electric intensity signal as a function of the first direct component of the first light intensity, a third proportional electric intensity signal as a function of the second light intensity of the second linearly polarized partial light signal, and a fourth proportional electric intensity signal as a function of the second direct component of the second light intensity; and a second circuit arrangement generating a measuring signal as a function of the first proportional electric intensity signal, the second proportional electric intensity signal, the third proportional electric intensity signal, and the fourth proportional electric intensity signal, the measuring signal being proportional to the following quotient:

$$(I2_{DC} \cdot I1 - I1_{DC} \cdot I2)/(I2_{DC} \cdot I1 + I1_{DC} \cdot I2),$$

wherein I1 is the first light intensity of the first linearly polarized partial light signal, wherein $I1_{DC}$ is the first direct component of the first light intensity, wherein I2 is the second light intensity of the second linearly polarized partial light signal, and wherein $I2_{DC}$ is the second direct component of the second light intensity, wherein the first polarization of the first linearly polarized partial light is different from the second polarization of the second linearly polarized partial light, and wherein the first direct component and the second direct component do not contain any one of the at least one frequency components of the periodic variable.

5. The arrangement according to claim 4, wherein the periodic variable includes a magnetic alternating field, and the sensor device includes a magnetooptical Faraday effect sensing device.

6. The arrangement according to claim 4, wherein the periodic variable includes at least one of an electric a.c. voltage and an electric alternating field, and wherein the sensor device includes an electrooptical Pockels effect sensing device.

7. The arrangement according to claim 4, further comprising at least one optical fiber providing the first and the second linearly polarized partial light signal to the first circuit arrangement.

8. The arrangement according to claim 7, wherein the at least one optical fiber includes at least two optical fibers, and the arrangement further comprising an optical connector coupling each one of the at least two optical fibers to another one of the at least two optical fibers.

* * * * *